United States Patent
Malaszewski et al.

(10) Patent No.: US 8,647,486 B2
(45) Date of Patent: Feb. 11, 2014

(54) MAGNET BAR SUPPORT SYSTEM

(75) Inventors: Leszek Malaszewski, Walnut Creek, CA (US); James G. Rietzel, Antioch, CA (US)

(73) Assignee: Applied Materials, Inc., Santa Clara, CA (US)

( * ) Notice: Subject to any disclaimer, the term of this patent is extended or adjusted under 35 U.S.C. 154(b) by 797 days.

(21) Appl. No.: 12/652,619

(22) Filed: Jan. 5, 2010

(65) Prior Publication Data

US 2010/0170780 A1 Jul. 8, 2010

Related U.S. Application Data

(60) Provisional application No. 61/142,521, filed on Jan. 5, 2009.

(51) Int. Cl.
*C23C 14/34* (2006.01)

(52) U.S. Cl.
USPC ............. 204/298.21; 204/298.12; 204/298.15

(58) Field of Classification Search
USPC ............. 204/298.12, 298.21, 298.22, 298.15, 204/298.16
See application file for complete search history.

(56) References Cited

U.S. PATENT DOCUMENTS

| | | | |
|---|---|---|---|
| 5,514,259 A * | 5/1996 | Shiota et al. | 204/298.19 |
| 5,556,519 A | 9/1996 | Teer | |
| 5,765,885 A * | 6/1998 | Netto | 292/318 |
| 6,156,170 A | 12/2000 | Akari et al. | |
| 6,224,725 B1 | 5/2001 | Glocker | |
| 6,290,825 B1 | 9/2001 | Fu | |
| 6,328,856 B1 | 12/2001 | Brucker | |
| 6,352,629 B1 | 3/2002 | Wang | |
| 6,372,098 B1 | 4/2002 | Newcomb et al. | |
| 6,488,824 B1 | 12/2002 | Hollars et al. | |
| 6,497,802 B2 | 12/2002 | Fu | |
| 6,497,803 B2 | 12/2002 | Glocker et al. | |
| 6,620,299 B1 | 9/2003 | Fietzke et al. | |
| 6,663,754 B2 | 12/2003 | Gung | |
| 6,733,642 B2 | 5/2004 | Glocker et al. | |
| 6,790,323 B2 | 9/2004 | Fu et al. | |
| 7,335,282 B2 | 2/2008 | Fu et al. | |
| 7,504,011 B2 * | 3/2009 | Schmidt et al. | 204/298.09 |
| 2004/0129561 A1 | 7/2004 | Barrett et al. | |

FOREIGN PATENT DOCUMENTS

| | | |
|---|---|---|
| JP | 11029866 A | 2/1999 |
| JP | 11071667 A | 3/1999 |
| KR | 10-2000-0057071 A | 9/2000 |

OTHER PUBLICATIONS

Drawings submitted for U.S. Appl. No. 10/338,190 to Barrett, May 19, 2003, p. 1-8.*
Groove (n) www.thefreedictionary.com/p/groove; retrieved Dec. 3, 2012.*
International Search Report and Written Opinion of the International Searching Authority for PCT/US2010/020079 mailed Jul. 29, 2010.

* cited by examiner

*Primary Examiner* — John Brayton
(74) *Attorney, Agent, or Firm* — Patterson & Sheridan, LLP

(57) ABSTRACT

An apparatus and method for controlling local deposition rate in a physical vapor deposition process is provided. A magnet bar assembly is disposed inside a sputtering target. The magnet bar assembly comprises a magnet bar, a support member aligned with the magnet bar, and one or more sliding brackets that couple the support member to the magnet bar. Each sliding bracket compresses the magnet bar to the support member, allowing the use of spacers between the support member and the magnet bar to adjust local proximity of the magnet bar to the plasma bombarding the target.

13 Claims, 2 Drawing Sheets

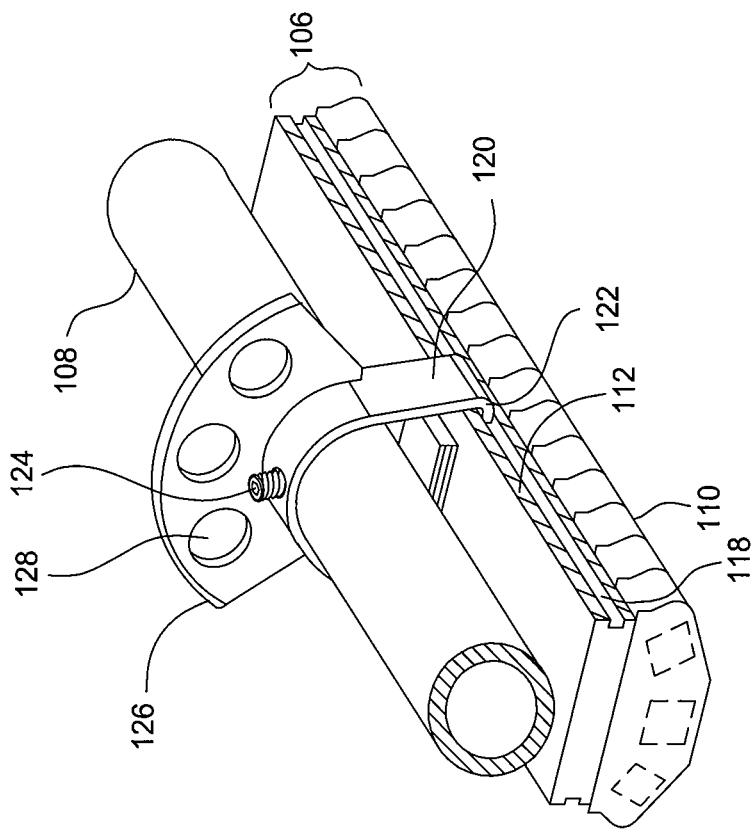
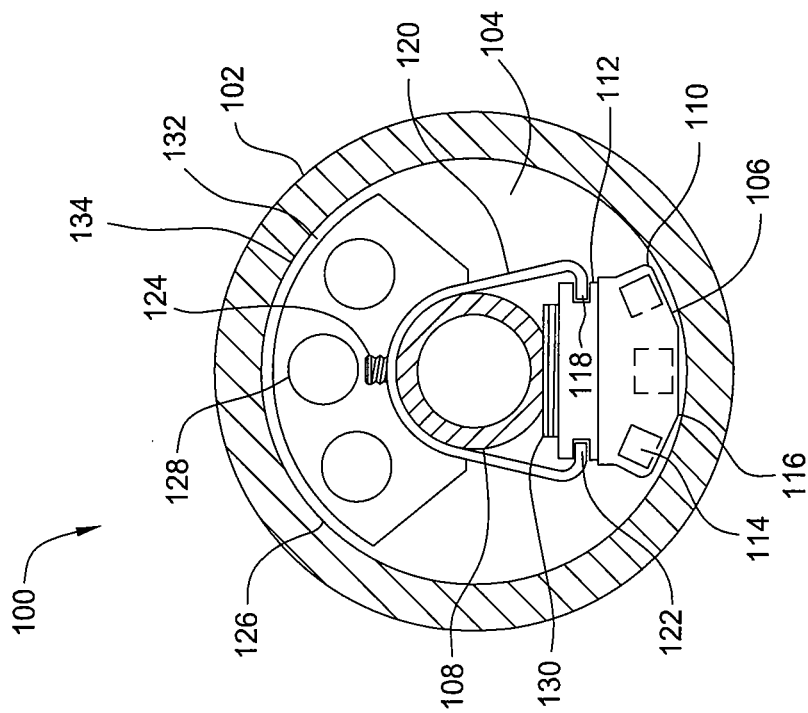
FIG. 1B
FIG. 1A

MAGNET BAR SUPPORT SYSTEM

CROSS-REFERENCE TO RELATED APPLICATIONS

This application claims benefit of U.S. Provisional Patent Application Ser. No. 61/142,521, filed Jan. 5, 2009, entitled "Flexible Magnet Bar/Shim Support System", which is herein incorporated by reference.

FIELD

Embodiments of the invention relate to apparatus and methods for performing physical vapor deposition on a substrate. More specifically, embodiments of the invention relate to sputtering target assemblies and magnet bar assemblies for sputtering apparatuses.

BACKGROUND

Physical vapor deposition, or sputtering, is a commonly used process for depositing material on a substrate. The material to be deposited is contained in a target generally disposed above the substrate to be coated, all in a vacuum chamber. A gas is provided to the chamber, and an electric potential applied to ionize the gas into a plasma. The ions are accelerated toward the target by a magnetic field provided by permanent magnets disposed in a convenient relationship to the target. The ions collide with the target, dislodging particles that fall onto the substrate below.

Deposition by sputtering is generally non-uniform for a variety of reasons. Density of the plasma may be affected by geometry of the apparatus. The magnetic field may be non-uniform due to variation among the magnets or in the relationship of the magnets to the target. In some cases, temperature variation at different locations on the target may result in non-uniform deposition. As the dimensions of devices and layers formed on substrates grows smaller with the general progression of miniaturization in the semiconductor industries, tolerance for non-uniformity diminishes as well, and other sources of non-uniformity, some of which may emanate from nature itself, must be managed. Thus, there is a continuing need for apparatus and methods for dynamically adjusting deposition rate profile in a sputtering process.

SUMMARY

Embodiments described herein provide a magnet bar assembly for a sputtering chamber, comprising a magnet bar, a support bar aligned with the magnet bar, and a bracket slidably coupled to the support bar and the magnet bar.

Other embodiments provide a sputtering chamber, comprising a substrate support disposed in an interior portion of the chamber, a sputtering target disposed opposite the substrate support, and a magnet bar assembly inside the sputtering target, the magnet bar assembly comprising a support tube, a magnet bar, and one or more adjustable fasteners holding the magnet bar against the support tube.

Other embodiments provide a method of dynamically adjusting deposition uniformity in a sputtering chamber, comprising adjusting the shape of a magnet bar disposed inside the sputtering target by inserting one or more spacers between the magnet bar and a support tube and clamping the spacers in place with an adjustable bracket.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a cross-sectional view of a sputtering target assembly according to one embodiment.

FIG. 1B is an isometric view of a magnet bar assembly used in the sputtering target assembly of FIG. 1A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2A:
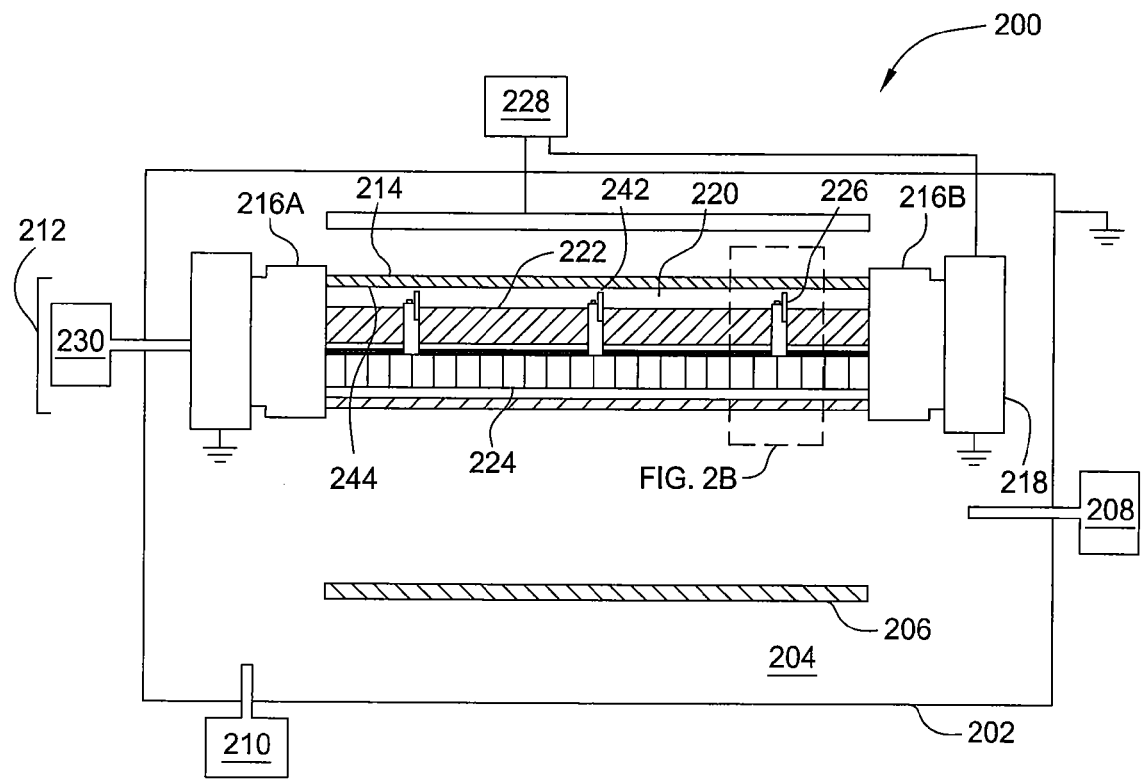
FIG. 2A is a side-view of a sputtering chamber with the sputtering target assembly of FIG. 1A according to another embodiment.

Embodiments described herein generally provide apparatus and methods for depositing a layer on a substrate by physical vapor deposition. In one example, a sputtering chamber has a substrate support in an interior portion of the chamber and a target assembly positioned opposite the substrate support. The target assembly comprises a sputtering target surrounding a magnet assembly. In this embodiment, the magnet assembly is a magnet bar assembly. The magnet assembly is deployed inside the sputtering target by coupling the magnet assembly to a support member that positions the magnet assembly in a desired configuration relative to the sputtering target. The exact configuration of the magnet assembly may be adjusted by adjusting one or more distances between the magnet assembly and the support member. In these embodiments, spacers are used to adjust the distances at selected locations. One or more spacers may be inserted between the magnet assembly and the support member at a location desirous of adjustment. The spacers change the spatial relationship between the magnet assembly and the sputtering target locally, resulting in an adjustment to the deposition rate in the vicinity of the spacers.

FIG. 1A is a cross-sectional view of a sputtering target assembly 100 according to one embodiment. The sputtering target assembly 100 comprises an annular sputtering target 102 and a magnet assembly 104 disposed inside the sputtering target 102. The magnet assembly 104 comprises a magnet bar 106 and a support member 108. The magnet bar 106 comprises one or more magnet units 110 attached to a coupling 112. Each magnet unit 110 comprises one or more magnets 114 enclosed in a casing 116. Magnet units 110 are attached to the coupling 112, one adjacent to the other, forming a line of magnet units 110 along the magnet bar 106, as shown in FIG. 1B.

The coupling 112 of the magnet bar 106 has recesses 118 formed therein to mate with a bracket 120. The bracket 120 has flexible extensions 122 for mating with the recesses 118, and extends from one recess 118 around the support member 108 to the other recess 118. The bracket 120 is held in place by a stop 124, which may be a fastener, clamp or set screw, that penetrates through the bracket 120 and contacts the support member 108. In some embodiments, the stop 124 allows application of a compressive force on the support member 108 and the magnet bar 106, the compressive force modulated by the flexible extensions 122 of the bracket 120. In other embodiments, the stop 124 prevents movement of the bracket 120 with respect to the support member 108 and the magnet bar 106, while the compressive force that urges the magnet bar 106 against the support member 108 is provided by the bracket 120.

In operation, a cooling fluid may be circulated through the interior of the sputtering target to maintain the target at a desired temperature. Baffles may be provided inside the target to cause turbulent flow of the cooling fluid, preventing formation of boundary layers that reduce the cooling effectiveness of the fluid. In the embodiment of FIG. 1A, the bracket 120 has a baffle 126 with one or more openings 128 for the fluid to pass through. The baffle 126 extends away from the magnet assembly 104 and is generally spaced apart from the inner diameter 134 of the target 102, forming a gap 132 to avoid contact between the baffle and the target 102 when the magnet assembly 104 is inserted or removed from the target 102. In most embodiments, the gap will range in dimension from about 3 mm to about 20 mm, such as from about 5 mm to about 15 mm, for example about 10 mm.

Proximity of the magnets to the target and to the plasma interacting with the target affects the deposition rate. Reducing the distance between the magnets and the portion of the target adjacent to the magnets incrementally strengthens the interaction between the magnetic field of the magnets and the plasma adjacent to the target. This interaction strengthens the attraction of charged particles to the target, increasing sputtering and deposition on the substrate in the vicinity. The distance between the magnet bar and the target may be adjusted at selected locations along the magnet bar by inserting spacers between the magnet bar and the support bar. In the embodiment of FIG. 1A, spacers 130 disposed between the magnet bar 106 and the support member 108 push the magnets 114 immediately below the spacers 130 toward the target 102. Near the location of the spacers, sputtering is intensified by the closer proximity of the magnets to the plasma, and deposition rate is increased. The spacers 130 will generally be co-located with the bracket 120 to ensure the spacers are securely held in place. Because the bracket 120 is able to slide along the magnet bar by virtue of the coupling 112, the spacers may be located at any point desirous of incremental adjustment in deposition rate. The amount the rate is adjusted may be influenced by the number of spacers inserted between the support bar and the magnet bar. A plurality of such brackets may be used for a given sputtering target, if needed, to make many local adjustments to deposition rate.

It should also be noted that the baffle illustrated in the embodiments of FIGS. 1A and 1B may be modified in any convenient way. For example, any number and any size openings in the baffle may be used, or the holes may be replaced by slots or notches in the extension portion of the baffle. Additionally, the baffle may be shaped in any convenient way, such as, for example, in a spiral configuration to promote spiral flow of the cooling liquid through the target. Specifically, a first edge of the baffle may attach to the bracket along a first axis while a second edge of the baffle traces a path along a second axis, different from the first axis and intersecting therewith.

In other variations, the bracket 120 may be made to extend around the magnet bar 106, wrapping around the magnet bar rather than mating with recesses in the coupling as shown in the embodiments of FIGS. 1A and 1B. Also, in other embodiments, each of the recesses 118 that mate with the extensions 122 may be a groove that is continuous along the length of the magnet bar 106, or each recess 118 may comprise a plurality of discrete openings repeated along the recess. The discrete openings may be repeated slots defined in the recess by a plurality of dividers such that each slot is similar in cross-sectional size to the cross-sectional size of the flexible extensions of the adjustable bracket. Continuous grooves provide maximum flexibility in locating the bracket at any desired point along the magnet bar, whereas discrete, repeated slots will provide extra positional stability to ensure the bracket does not shift with the force of the flowing cooling fluid.

In operation, the magnet bar assembly described above facilitates local adjustment of deposition rate through manipulation of the local proximity of the magnet bar to the sputtering plasma. The magnet bar assembly can be removed from the sputtering target and brackets and spacers added, moved, or removed, as required to create uniform deposition across a substrate or adjust the deposition rate profile across the substrate in any desired way.

The bracket 120 may be any coupling device that provides an attractive force between the magnet bar 106 and the support bar 108. The attractive force may be adjusted or moderated by a stop such as the stop 124, or it may be a property of the coupling device itself. A coupling device usable for embodiments described herein will be movable along the magnet assembly 104 for easy adjustment to any location along the magnet assembly 104. The coupling device also has some flexibility to permit insertion of the spacers 130 between the magnet bar 106 and the support bar 108. In some embodiments, the coupling device may be removably attached to the magnet bar 106, the support bar 108, or both. In other embodiments, the coupling device may wrap around the magnet bar 106, the support bar 108, or both. In some embodiments, the coupling device may be a band disposed around the support bar 108 and the magnet bar 106. Such a band may be stretchable to provide the flexibility to accommodate spacers. For example, a band of rubber, plastic, or metal may be used. In other embodiments, the support bar 108 and magnet bar 106 may have a series of lateral protrusions that accommodate flexible or stretchable straps from protrusions on the support bar 108 to protrusions on the magnet bar 106. Such flexible or stretchable straps may provide a great deal of freedom in arranging the placement of spacers between the support bar 108 and the magnet bar 106.

FIG. 2A is a side view of a sputtering chamber 200 according to another embodiment of the invention. The chamber 200 comprises a chamber wall 202 enclosing an interior portion 204 of the chamber 200, with a substrate support 206 disposed in the interior portion 204 of the chamber 200. Gas is supplied to the chamber by gas source 208, and vacuum is maintained by vacuum source 210.

A sputtering target assembly 212 is disposed in the interior portion 204 of the chamber 200 opposite the substrate support 206. The sputtering target assembly 212 comprises a sputtering target 214 mounted on supports 216A and 216B, one at either end of the target 214. In some embodiments, the supports 216A and 216B may facilitate rotation of the target 214. For example, in one embodiment, the support 216A is a bearing block and the support 216B is a drive block. In embodiments wherein support 216B is a drive block, the rotational drive of drive block 216B may be powered by a motor 218.

A magnet bar assembly 220 is disposed inside the sputtering target 214. The magnet bar assembly 220 comprises a support tube 222, a magnet bar 224, and one or more adjustable fasteners 226 holding the magnet bar 224 against the support tube 222. The adjustable fasteners 226 will be explained in more detail below. A power supply 228 applies an electric potential to the sputtering target 214, which generates a plasma in the chamber from the gas supplied by the gas source 208. The magnet bar 224 generates a magnetic field that accelerates the charged particles of the plasma toward the sputtering target 214, dislodging particles that fall onto a substrate disposed on the substrate support 206.

The energetic collision of ions from the plasma with the sputtering target 214 causes the temperature of the sputtering target 214 to rise. A cooling medium may be provided to the interior of the sputtering target 214 by cooling source 230. The cooling medium generally flows through the space between the support tube 222 and the sputtering target 214, maintaining the sputtering target 214 at a desired temperature. Each adjustable fastener 226 will generally define a gap 242 with the inner surface 244 of the sputtering target 214, similar to the gap discussed in connection with FIG. 1A.

The deposition rate depends on the rate at which particles are dislodged from the sputtering target, which in turn depends on the rate of bombardment by ions from the plasma. Due to numerous factors, in an individual sputtering process the rate may vary along the target and across the substrate, producing non-uniform deposition. The local magnetic field strength influences the rate at which material is dislodged from the sputtering target at a given location. In the embodiment of FIG. 2A, the local magnetic field strength may be adjusted by making incremental adjustments to the spacing between the magnet bar 224 and the sputtering target 214.

Figure 2B:
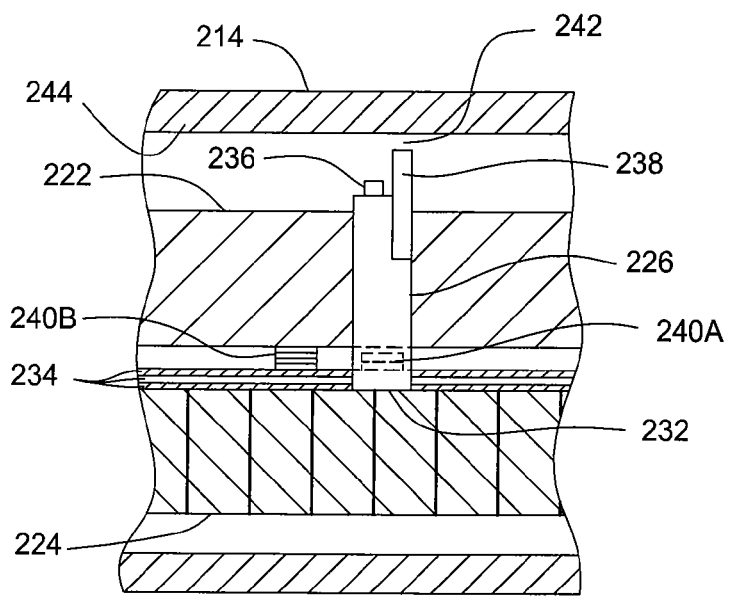
FIG. 2B is a detail view of an adjustable fastener used in the sputtering chamber of FIG. 2A.

FIG. 2B is a detail view showing one of the one or more adjustable fasteners 226. Each of the adjustable fasteners 226 comprises one or more flexible extensions 232 that mate with recesses 234 on the magnet bar 224. The fastener 226 wraps around the support tube 222 and mates with recesses 234 on either side of the magnet bar 224 to hold the magnet bar 224 against the support tube 222. Each fastener 226 is held in place by one or more stops 236, which may be set screws or clamps in some embodiments. In some embodiments, the stops 236 penetrate the fastener 226 and impinge the support tube 222, while in other embodiments, the stops 236 may contact the support tube 222 adjacent to the fastener 226 to prevent movement of the fastener 226. Each fastener 226 may also comprise a baffle 238 of any convenient design to turbulize the flow of cooling medium through the sputtering target.

As discussed above, the distance between the magnet bar 224 and the sputtering target 214 may be adjusted locally by the use of spacers 240A or 240B. The spacers 240A and 240B are substantially co-located with the fastener 226 to prevent unwanted movement of the spacers 240A and 240B. The spacers 240A are located in the direct line of the compressive force applied to the support tube 222 and the magnet bar 224 by the fastener 226, and are thus most securely held. The spacers 240B, however, may also be securely held if they are close enough to the fastener 226 to be subject to enough compressive force between the support tube 222 and the magnet bar 224. In either case, the spacers are substantially co-located with the fastener 226, and locally adjust the spacing between the magnet bar 224 and the sputtering target 214, influencing the local rate of deposition on the substrate. Any number of spacers may be used as required to make the deposition rate uniform or to achieve any desired deposition rate profile, and any number of fasteners may be used to apply spacers at locations desirous of adjustment.

In some embodiments, the flexible extensions of the adjustable fasteners may mate with recesses that are continuous grooves along the length of the magnet bar. In other embodiments, the recesses may comprise discrete holes along the sides of the magnet bar into which the flexible extensions seat. Use of discrete holes for mating with the flexible extensions may provide more positional stability for the fasteners, preventing them from shifting under the force of the cooling medium flowing through the target. In other embodiments, the flexible extensions may extend around the magnet bar, rather than engaging recesses, grooves, or holes on the side of the magnet bar.

In the embodiments of FIGS. 1A and 2B, the spacers may be made of any convenient material, which will preferably be a strong material. The spacers may have a degree of malleability or compressibility, but should not collapse or extrude under the compressive force of the bracket 120 or the fastener 226. Spacers may be metal, such as aluminum, plastic, or hard rubber, for example. Spacers will generally have thickness that facilitates unitizing their use, such as between about 0.1 and about 0.5 mm, for example.

In some embodiments, the spacers may be shaped to facilitate placement between a magnet bar and support bar of a magnet assembly. The spacers may, for example, have contoured edges such that they nest together, reducing the likelihood that a spacer will slip under pressure between the support bar and magnet bar. Slippage may also be reduced by using spacers having a surface designed to reduce slippage, such as a corrugated surface that matches a corrugated surface of another spacer such that the two nest together.

Some embodiments provide a method of adjusting the deposition uniformity in a sputtering reactor. The proximity of magnets in the reactor to a plasma formed in the reactor is adjusted locally to influence the local deposition rate. An adjustable fitting is used to position spacers between one or more magnets and a support member, and then clamp the spacers in place. The magnets may be part of a magnet assembly in some embodiments, so that individual spacers may be used to adjust a portion of the magnet assembly without affecting the rest.

The spacers may be held in place by applying a compressive force between the magnets or magnet assembly and a support member. The compressive force may be applied using a bracket or clamp that pushes the magnet or magnet assembly against the support member. Spacers between the two are held in place by the compressive force. The clamp may apply the compressive force by attaching to the support member and the magnet or magnet assembly, or in some embodiments the clamp may merely encircle the support member and magnet assembly without attaching to them.

In some embodiments, the clamp or bracket is adjustable to different positions along the support member. For example, in embodiments featuring a plurality of magnets in a magnet assembly adjacent to a support member, a clamp or bracket may slide along the support member and attach or encircle the magnet assembly to allow location of spacers at any desired point along the magnet assembly. If the magnet assembly and support member are elongated, for example if the support member is a support tube and the magnet assembly is oriented along the length of the support tube, the clamp may be slidably attached to the support member and magnet assembly such that it may be repositioned as needed.

In some embodiments, multiple spacers and clamps may be used to adjust more than one magnet or location on a magnet assembly. In one location, a first plurality of spacers may be required, and in another location a second plurality of spacers, wherein the first plurality and the second plurality are different in number. In some cases, adjustment of clamps and spacers may be motivated by monitoring deposition rates on successive substrates or by monitoring plasma conditions, or both. Any drift in deposition uniformity may be detected by suitable means, and a compensating adjustment made to the clamps and spacers to preserve maximum uniformity.

In some embodiments, it may be desired to produce a predetermined non-uniformity in deposition using a sputtering process. This, also, may be done by using adjustable clamps and spacers, as described herein. In general, a certain configuration of spacers and clamps will be required to achieve uniform deposition. If this configuration is known prior to depositing on a substrate, an engineered non-uniform deposition may be achieved by non-incremental placement of spacers and clamps. Any location required to provide a rapid change in deposition rate may have spacers and clamps added at that location.

In some embodiments, more than one target assembly may be used to sputter material onto a substrate. In such embodiments, further control of local deposition rate may be accomplished through movement and spacing of the target assemblies with respect to each other. If deposition rate is too high in a first location and not high enough in a second location, a target may be moved closer to the second location and further from the first location to achieve the desired result. In one embodiment, the target assemblies may each feature mounting brackets on either end for mounting on rails. Such mountings would enable the target assemblies to slide to any desired position above the substrate. The slidable target assemblies may be held in place by any form of stop, such as a clamp, at one or both ends of the assembly.

Methods described herein may also be used to adjust consumption of a sputtering target. In most rotating target sputtering chambers, the cylindrical target is consumed fastest near the ends of the target, known as the turnaround areas, due to high plasma power density. The disparity in consumption rate of the cylindrical target may be reduced by using a magnet assembly and support member with spacers held by adjustable clamps, brackets, or bands as described herein.

Spacers may be added to locations along the central region of the magnet assembly between the magnet assembly and the support member to increase sputtering rate along the medial portion of the target. The spacers reduce the space between the magnet assembly and the plasma, drawing ions from the plasma toward the target at a higher rate. In general, consumption uniformity may be adjusted by identifying portions of the target being consumed more slowly than desired and portions being consumed more quickly than desired. The space between the magnets of the magnet assembly and the plasma is reduced adjacent to the portions being consumed too slowly and increased adjacent to the portions being consumed too quickly.

While the foregoing is directed to embodiments of the invention, other and further embodiments of the invention may be devised without departing from the basic scope thereof.

What is claimed is:

1. A magnet bar assembly for a sputtering chamber, comprising:
    a magnet bar configured to be disposed inside a cylindrical sputtering target;
    a support bar aligned with the magnet bar; and
    a bracket coupling the support bar to the magnet bar, the bracket slidably and axially positionable along the magnet bar without changing a position of the magnet bar relative to the support bar;
    wherein the magnet bar has one or more recesses for engaging the bracket;
    and wherein the bracket is disposed around the support bar and has integral projections for insertion into the recesses in the magnet bar.

2. The magnet bar assembly of claim 1, further comprising a connector between the magnet bar and the support bar, wherein the connector has one or more recesses for engaging the bracket.

3. The magnet bar assembly of claim 1, further comprising one or more stops on the support bar associated with the bracket.

4. The magnet bar assembly of claim 1, wherein the bracket further comprises one or more baffles.

5. The magnet bar assembly of claim 1, further comprising one or more spacers between the magnet bar and the support bar.

6. The magnet bar assembly of claim 5, wherein the bracket has flexible projections that engage the recesses in the magnet bar.

7. The magnet bar assembly of claim 1, further comprising one or more spacers between the magnet bar and the support bar and one or more stops that fix the location of the bracket on the support bar, wherein the spacers adjust a distance between the magnet bar and an internal surface of the target.

8. A sputtering chamber, comprising:
    a substrate support in an interior portion of the chamber;
    a cylindrical sputtering target positioned opposite the substrate support; and
    a magnet bar assembly disposed adjacent an internal surface of the sputtering target, the magnet bar assembly comprising a support member, a magnet bar, and one or more fasteners coupling the magnet bar to the support member, the fasteners slideably and axially positionable along the support member without changing a position of the magnet bar relative to the support member;
    wherein each of the one or more slideable fasteners has an integral flexible extension that mates with a recess on the magnet bar.

9. The sputtering chamber of claim 8, further comprising one or more spacers disposed between the magnet bar and the support member, each spacer substantially co-located with a slidable fastener.

10. The sputtering chamber of claim 8, wherein each of the one or more recesses comprises a plurality of discrete openings shaped to receive the flexible extension of a slidable fastener.

11. The sputtering chamber of claim 8, wherein each of the one or more recesses is a groove shaped to receive the flexible extension of a slidable fastener.

12. The sputtering chamber of claim 9, wherein each of the one or more slidable fasteners has a baffle that extends away from the magnet bar assembly.

13. The sputtering chamber of claim 12, wherein each of the one or more slidable fasteners is held in place by one or more stops.

* * * * *

UNITED STATES PATENT AND TRADEMARK OFFICE
CERTIFICATE OF CORRECTION

PATENT NO. : 8,647,486 B2  
APPLICATION NO. : 12/652619  
DATED : February 11, 2014  
INVENTOR(S) : Malaszewski et al.

Page 1 of 1

It is certified that error appears in the above-identified patent and that said Letters Patent is hereby corrected as shown below:

In the Specification

Column 4, Line 52, please delete "2168" and insert --216B-- therefor;

Column 4, Line 58, please delete "2168" and insert --216B-- therefor.

Signed and Sealed this  
Seventeenth Day of June, 2014

Michelle K. Lee  
*Deputy Director of the United States Patent and Trademark Office*